United States Patent [19]
Parke

[11] Patent Number: 6,098,637
[45] Date of Patent: Aug. 8, 2000

[54] IN SITU CLEANING OF THE SURFACE INSIDE A VACUUM PROCESSING CHAMBER

[75] Inventor: Vijay Parke, Sunnyvale, Calif.

[73] Assignee: Applied Materials, Inc., Santa Clara, Calif.

[21] Appl. No.: 09/034,053

[22] Filed: Mar. 3, 1998

[51] Int. Cl.[7] ........................................ B08B 7/00
[52] U.S. Cl. .......................... 134/1.1; 118/50.1; 118/724; 156/345; 216/66; 134/1.3; 438/708
[58] Field of Search ..................... 118/725, 728, 118/719, 50.1, 723 R, 724; 156/345; 134/1.1, 1.2, 1.3; 204/298.35; 216/66; 438/708, 711

[56] References Cited

U.S. PATENT DOCUMENTS

| | | | |
|---|---|---|---|
| 4,699,689 | 10/1987 | Bersin | 156/643 |
| 5,223,112 | 6/1993 | Tepman . | |
| 5,478,401 | 12/1995 | Tsunekawa et al. | 134/1 |
| 5,480,492 | 1/1996 | Udagawa et al. . | |
| 5,531,857 | 7/1996 | Engelsberg et al. . | |
| 5,863,327 | 1/1999 | Thakur | 118/50.1 |

FOREIGN PATENT DOCUMENTS

| | | | |
|---|---|---|---|
| 0 316 835 A1 | 5/1989 | European Pat. Off. | H01L 21/306 |
| 0 606 648 A2 | 7/1994 | European Pat. Off. | H01L 21/56 |
| 0 606 648 A3 | 7/1994 | European Pat. Off. | H01L 21/56 |
| 0 771 638 A2 | 5/1997 | European Pat. Off. | B29C 45/17 |
| 0 771 638 A3 | 5/1997 | European Pat. Off. | B29C 45/17 |
| 60058238 | 4/1985 | Japan | B01J 19/12 |
| 05143981 | 6/1993 | Japan | G11B 5/84 |
| 07068162 | 3/1995 | Japan | B01J 19/12 |
| 07308567 | 11/1995 | Japan | B01J 3/00 |

OTHER PUBLICATIONS

PCT International Search Report dated Jun. 11, 1999.
K. Yamaguchi, Y. Uematsu, Y. Ikoma, F. Watanabe, T. Motooka and T. Igarashi, "Thermal Desorption Spectroscopy, and Molecular Beam Time–of–Flight Studies of Silicon Wafer Ultraviolet/Ozone Cleaning," J. Vac. Sci. Technol. B 15(2), Mar./Apr. 1997, pp. 277–281.

*Primary Examiner*—Thi Dang
*Assistant Examiner*—Luz Alejandro
*Attorney, Agent, or Firm*—Thomason, Moser & Patterson

[57] ABSTRACT

The invention provides generally a method and an apparatus for in situ cleaning of a surface in a semiconductor substrate processing chamber which operates quickly and reduces the downtime for chamber cleaning. The apparatus comprises an ultraviolet (UV) radiation plate moveable between a cleaning position and a storage position and at least one UV radiation source disposed on the UV radiation plate. Preferably, the apparatus includes a reflector disposed adjacent the UV radiation source to focus emitted UV radiation and a rotary actuator pivotally attached to a transport arm to move the UV radiation plate between the cleaning position and the storage position. The method comprises: providing a UV radiation plate having at least one UV radiation source disposed thereon, moving the UV radiation plate into a cleaning position, introducing a cleaning gas into the processing chamber and exposing the surface to UV radiation.

29 Claims, 5 Drawing Sheets

IN SITU CLEANING OF THE SURFACE INSIDE A VACUUM PROCESSING CHAMBER

BACKGROUND OF THE INVENTION

1. Field of the Invention

The present invention relates generally to a vacuum processing chamber. More specifically, the present invention relates to a method and apparatus for in situ cleaning of a vacuum chamber surface and a surface of a component in the chamber.

2. Background of the Related Art

During fabrication of integrated circuits and flat panel displays, substrates are typically held by a substrate chuck which uses either a vacuum, mechanical, electrical or magnetic means to hold a substrate in place. These chucks are typically constructed of either ceramic or aluminum. Recently, electrostatic ceramic chucks have become widely used, and one exemplary electrostatic ceramic chuck is the MCA™ electrostatic ceramic chuck available from Applied Materials, Inc., of Santa Clara, Calif. Typically, electrostatic chucks are used in semiconductor processing chambers and systems such as the Endura™ system available from Applied Materials, Inc., Santa Clara, Calif. In the case of ceramic electrostatic chucks, it is critical to maintain a good dielectric layer between the chucking electrode and the substrate so that an appropriate electrostatic charge can be established on the chuck to hold the substrate in place. However, as a chuck holds a substrate during processing or is covered during cleaning, material from the process, as well as dirt, metal dust, chemicals, and other debris, can adhere to or react with the chuck, especially at high temperatures. These contaminants hinder the ability of the chuck to establish a charge separation required to properly hold the substrate on the chuck. The formation of a conducting layer on the surface provides an electrical path for the charge, resulting in leakage of the charge to the substrate and a loss of the chuck's ability to hold a substrate. To restore the chuck's ability to hold a substrate, the chuck must be periodically cleaned.

One method of cleaning a ceramic chuck involves filling the chamber with argon and applying a bias to the chuck that creates a plasma bombardment of the chuck to effect sputter cleaning of the surface. However, each application of argon plasma bombardment cleaning typically removes about 50 angstroms of material from the chuck, and as repeated cleaning erodes the outer surface of the chuck, the chuck becomes un-useable and needs to be replaced.

Another method of cleaning a ceramic chuck is a wet cleaning process which requires the system to be first vented to atmospheric pressure, then opened, cleaned, and subsequently returned to vacuum. Wet cleaning procedures typically require a washing step using an acid, followed by a light base cleaning step. Wet cleaning also typically requires a subsequent drying step which takes up tremendous valuable time and drastically reduces throughput.

UV radiation/ozone processes have been applied to the cleaning and stripping of contaminants from silicon substrates. One method, as disclosed in U.S. Pat. No. 5,480,492, cleans a surface of a silicon substrate by heating the contaminants thereon to a temperature greater than 750° C. and simultaneously applying ultraviolet rays and oxygen molecules to the surface. However, this method is unsuitable for chamber cleaning because it requires a high temperature, produced by heaters such as lasers, that can cause damage to some surfaces.

U.S. Pat. No. 5,531,857 discloses an apparatus which uses a robot having gas passages and radiation passages therein to deliver UV radiation and gas to clean a surface within a chamber. However, this device does not meet the needs of modem vacuum semiconductor substrate processing because it is bulky, operates slowly, and is itself subject to the same contamination that threatens the chuck and other interior surfaces of the vacuum processing chamber because it is disposed within the processing chamber.

Therefore, there exists a need for an in situ vacuum processing chamber cleaning device and a process which operates quickly and reduces the process downtime for chamber cleaning. Preferably, the cleaning device occupies minimal operating space and is shielded from vacuum chamber processing operations.

SUMMARY OF THE INVENTION

The invention provides generally a method and an apparatus for in situ cleaning of a surface in a semiconductor substrate processing chamber that operates quickly and reduces the process downtime for chamber cleaning. The apparatus comprises an ultraviolet (UV) radiation plate moveable between a cleaning position and a storage position and at least one UV radiation source disposed on the UV radiation plate. Preferably, the apparatus includes a reflector disposed adjacent the UV radiation source to focus emitted UV radiation and a rotary actuator pivotally attached to a transport arm to move the UV radiation plate between the cleaning position and the storage position. The method comprises the steps of: providing a UV radiation plate having at least one UV radiation source disposed thereon, moving the UV radiation plate into a cleaning position, introducing a cleaning gas into the processing chamber and exposing the surface to UV radiation.

One aspect of the invention provides a UV radiation source plate that can be transferred into and out of a processing chamber similarly to a substrate for processing. Alternatively, the UV radiation plate is rigidly mounted on a transfer arm in the processing chamber. Another aspect of the invention provides fast cleaning of a surface inside a chamber without breaking vacuum. Another embodiment of the invention positions the UV radiation source along with, or in the place of, "bake-out" lamps disposed within a substrate processing chamber.

DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefor not to be considered limiting of its scope, for the invention may admit to other equally effective embodiments.

DETAILED DESCRIPTION OF A PREFERRED EMBODIMENT

The invention generally provides a method and an apparatus for in situ cleaning of a vacuum processing chamber. One embodiment of the invention provides an apparatus which transfers a UV radiation source between a retracted position and an extended position where the UV radiation source is disposed over and directed at a substrate support member to effect enhanced cleaning of the substrate support member, preferably in the presence of ozone. When the cleaning process is complete, the apparatus retracts to a position out of the way of normal handling and processing operations. Other embodiments of the invention provide a UV radiation source mounted along-side or in place of vacuum processing chamber bake-out lamps.

Figure 1:
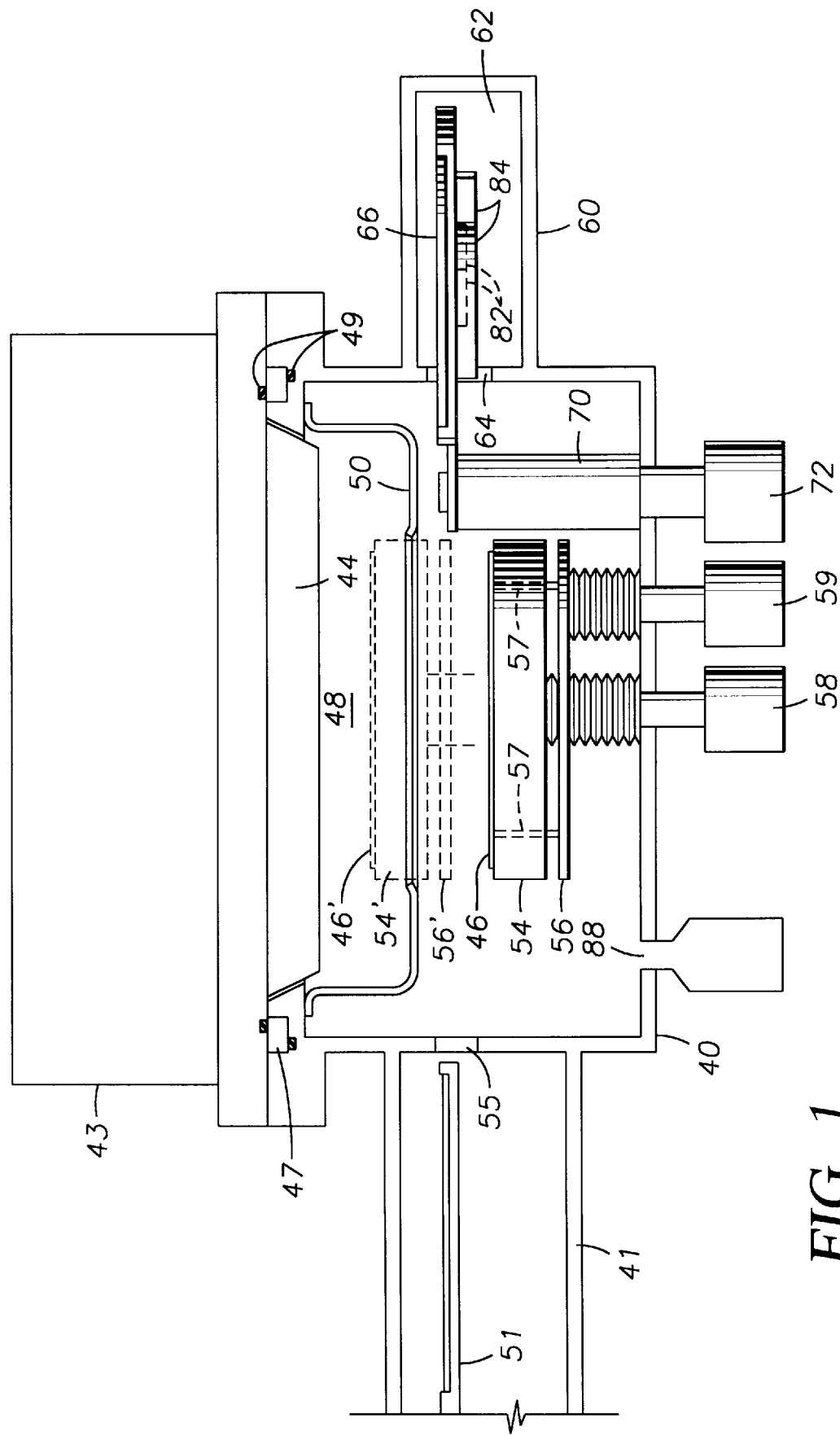
FIG. 1 is a vertical cross-sectional schematic view of a processing chamber having a UV radiation source cleaning device in accordance with the invention.

FIG. 1 is a vertical cross-sectional schematic view of a processing chamber having a UV radiation source cleaning device in accordance with the invention. Although the processing chamber as shown and described is a physical vapor deposition (PVD) chamber used for sputtering a metal coating onto a substrate, the invention can be incorporated as well into a chemical vapor deposition (CVD) chamber, an etch chamber and other processing chambers. As shown in FIG. 1, a housing 40 generally encloses a bottom portion of a processing chamber 42 and an anode lid assembly 43 generally encloses an upper portion of the processing chamber 42. A target 44 made of sputterable material is attached to the anode lid assembly 43 and connected to a power supply (not shown) which energizes the target 44 for sputtering deposition material onto a substrate. The anode lid assembly 43 is electrically isolated from the housing 40 by an insulative ring 47 and pneumatically sealed by resilient O-rings 49.

A substrate support member 54 disposed at the bottom portion of the chamber is moved by an actuator 58 between a lower position as indicated by the solid line and an upper position as indicated by the dashed lines 54'. Preferably, the substrate support member 54 comprises a ceramic outer body enclosing an electrode to form an electrostatic chuck that provides the appropriate charge to hold a substrate 46 on the support member 54. The substrate support member 54 includes vertical bores adapted for lift pins 57 to move up and down to position a substrate on and off the substrate support member 54 to allow transfer of the substrate in and out of the chamber. The lift pins 57 are disposed on a lift assembly 56 attached to a second actuator 59 that moves the lift assembly 56 vertically.

A sputtering region 48 is defined by the target 44, the substrate 46 in position 46' and a cathode forming bowl 50 attached to the upper portion of the chamber. The cathode forming bowl 50 includes an upturned wall 36 defining a central opening adapted to allow free movement of the substrate support member 54. The cathode and the anode electrical connections are respectively connected to the chamber components in a manner well known in the art. A clamp ring 52 having an inner periphery 37 that defines a processing aperture or opening is disposed on the cathode forming bowl 50. During processing, a substrate 46 positioned on the substrate support member 54 moves up through the central opening defined by the upturned wall 36 and engages the clamp ring 52, and an upper surface of the substrate is exposed through the opening defined by the inner periphery 37 of the clamp ring 52 to receive processing.

The processing chamber 42 preferably includes at least one gas inlet 86 disposed at the upper portion of the chamber to supply the processing gas to the sputtering region 48 and a gas exhaust 88 disposed at the bottom portion of the chamber to pump the gas out of the chamber. Preferably, the gas inlet 86 selectively provides processing gas, cleaning gas and other gases according to the process performed. Preferably, a suitable pump, such as a turbo molecular pump 90, is attached to the gas exhaust 88 to evacuate the chamber and to create a vacuum environment.

A robot (not shown) having a robot blade 51 transfers substrates in and out of the vacuum chamber 42 through a slit valve 55 on a side wall of housing 40 and a communicating passageway 41 extending from one side of housing 40. A second housing 60 extends from a second side of the housing 40, forming a sub-chamber 62 which communicates with the chamber 42 by means of a slit 64. The second housing 60 provides a retraction compartment for a UV radiation source plate 66 and shields the UV radiation source plate 66 from the processing environment during processing.

Preferably, the UV radiation source plate 66 is made of a metal such as titanium or stainless steel, or a ceramic such as $Al_2O_3$. The UV radiation source plate 66 includes a UV radiation source 82 disposed on the lower surface of the plate. A UV radiation reflector 84 is preferably disposed adjacent the UV radiation source 82 to focus the UV radiation onto a surface to be cleaned. The UV radiation source plate 66 rests on a supporting surface of a transport arm 68 which is connected to the rotatable shaft 70 of a rotary actuator 72. The rotary actuator 72 rotates the transport arm 68 between a retracted position within the sub-chamber 62 and an extended position in the chamber 42. As shown in FIG. 1, the rotatable shaft 70 is disposed within the chamber 42, and the rotary actuator 72 is secured on the bottom portion of housing 40. Alternatively, the rotatable shaft 70 and the rotary actuator 72 can be disposed within the sub-chamber 62 and secured on the housing 60. Although a rotary transport mechanism has been described, other mechanisms of transporting the UV radiation plate 66 are contemplated by the invention.

Figure 2:
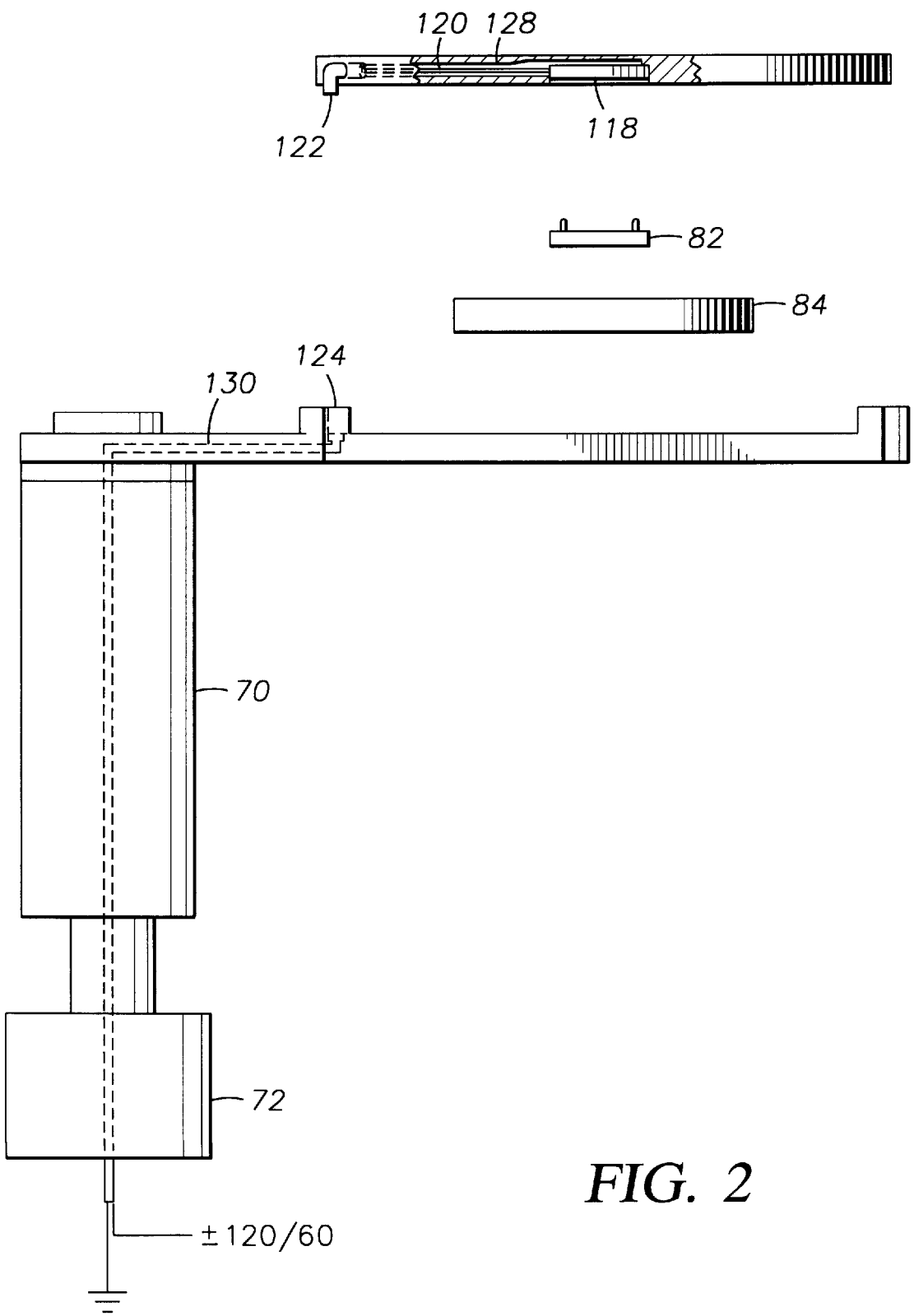
FIG. 2 is a bottom view of a UV radiation source plate and a transport arm.
Figure 3:
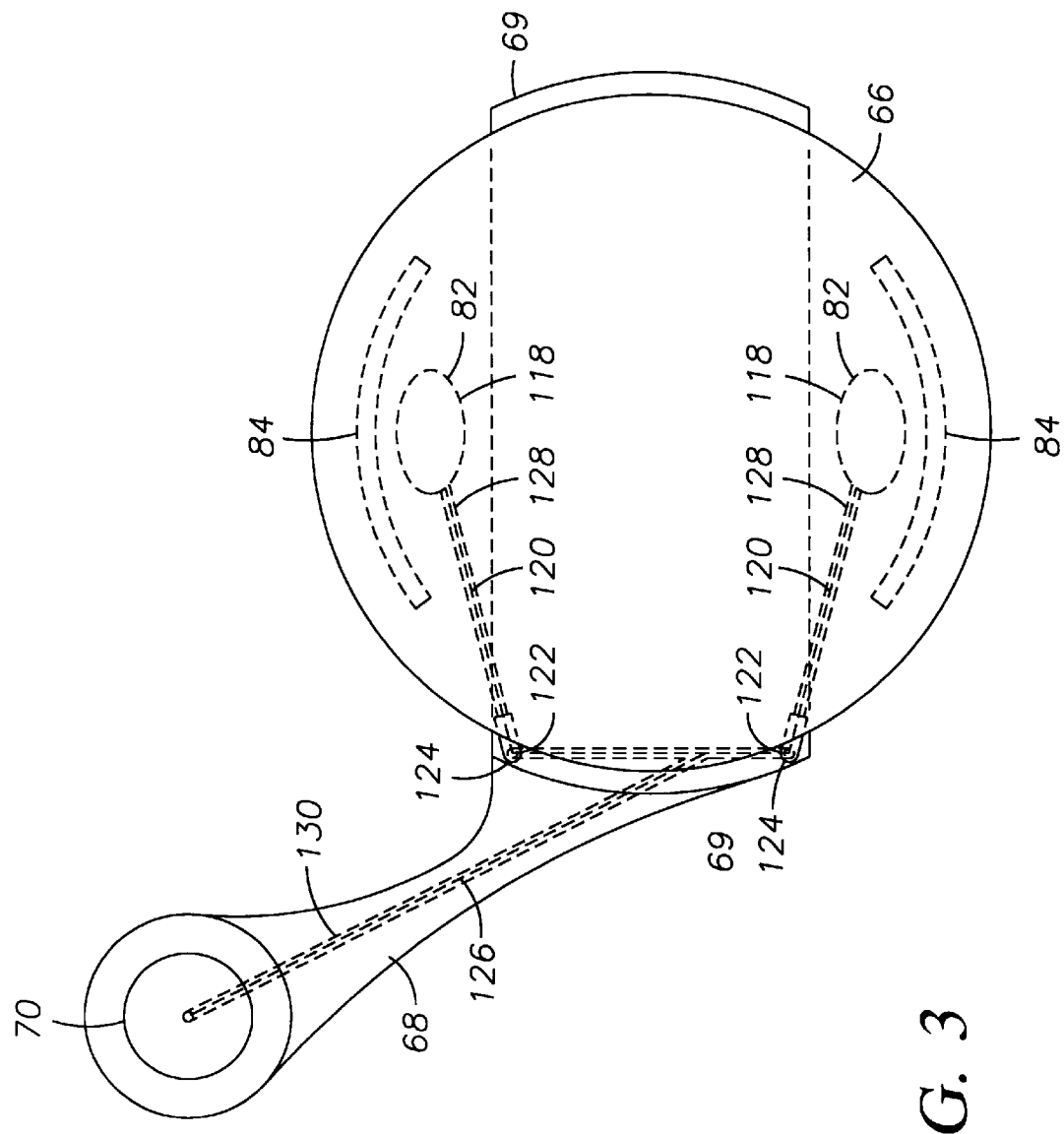
FIG. 3 is an exploded side view of a UV radiation source plate and a transport arm.

FIG. 2 is a bottom view of a UV radiation source plate 66 and a transport arm 68. FIG. 3 is an exploded side view of a UV radiation source plate 66 and a transport arm 68 showing the wires 120 disposed through the UV radiation source plate 66 in the conduits 128 inside the UV radiation source plate 66. Preferably, the UV radiation source plate 66 includes two UV radiation sources 82 disposed at radially opposite positions on two corresponding UV radiation source mountings 118 on a lower surface of the UV radiation source plate 66 and electrically connected to the wires 120. Also, two UV radiation reflectors 84 are positioned adjacent the UV radiation sources 82 to focus the emitted UV radiation onto the surface to be cleaned. However, any number of sets of UV radiation sources 82, mountings 118 and reflectors 84 can be used depending on the size of the system and the process to be performed. Preferably, an electrical connector 122 disposed on the UV radiation source plate 66 is provided for each UV radiation source 82 to connect to electrical power through wires 120. The UV radiation sources 82 can be any custom or standard UV radiation bulb or device capable of operation in a vacuum environment. Preferably, the UV radiation sources 82 are releaseably secured in the UV radiation source mountings 118 to allow easy replacement as needed.

The UV radiation source plate 66 is removably disposed on the transport arm 68 and secured by lips 69 in the proper orientation. The lips 69 preferably include sockets 124 to accommodate or receive the electrical connectors 122. The sockets 124 further ensure that the UV radiation source plate 66 is aligned in the proper orientation by connecting to the electrical connectors 122. Wires 126 carry power from a power supply 127 to the sockets 124 through the conduit 130 within the transport arm 68 and the rotatable shaft 70 to power the UV radiation source plate 66.

Figure 4:
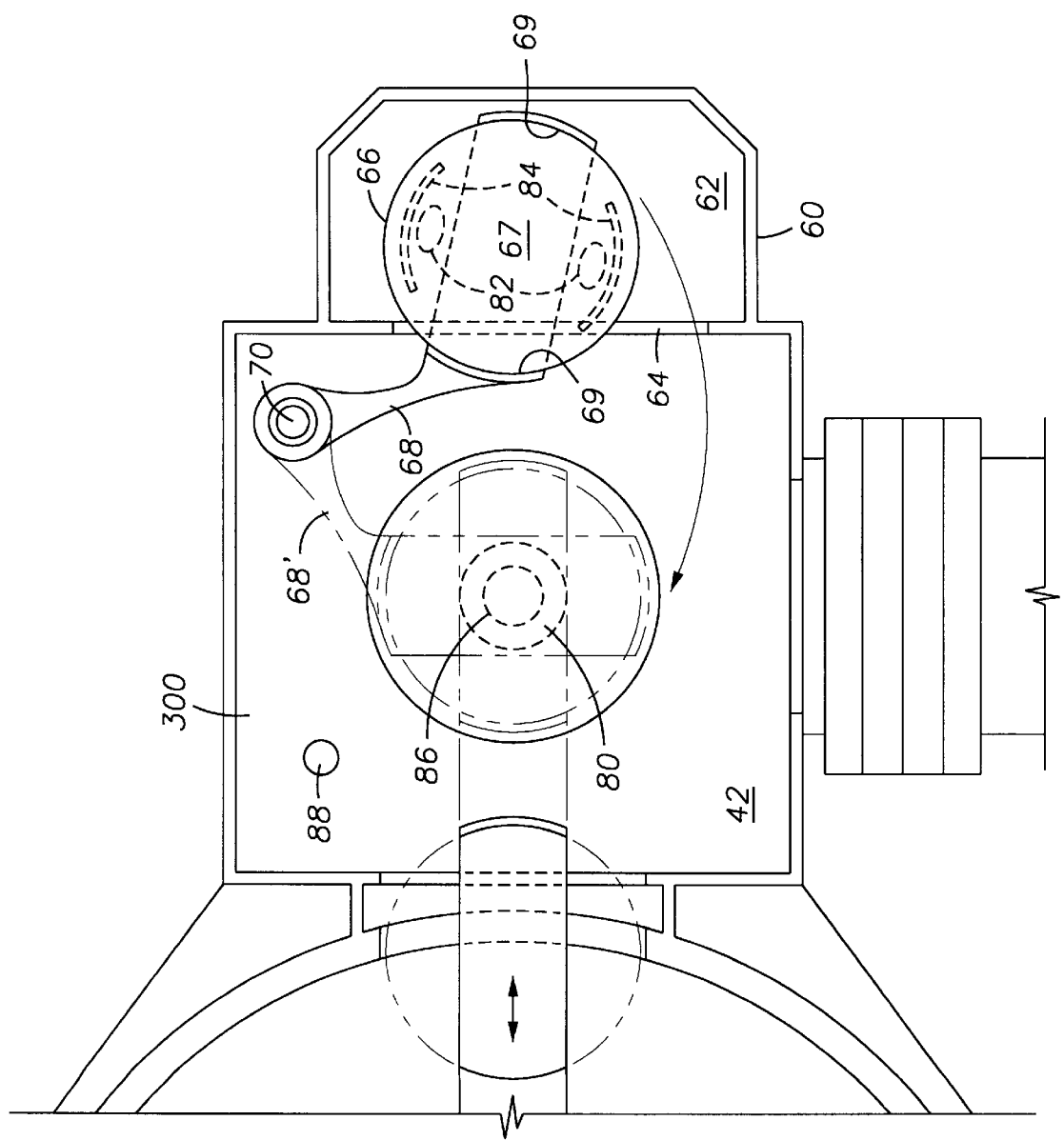
FIG. 4 is a top schematic view of a processing chamber having a UV radiation source cleaning device in accordance with the invention.

FIG. 4 is a top schematic view of a processing chamber having a UV radiation source cleaning device in accordance with the invention. The UV radiation source plate 66 rests on a supporting surface 67 on the transport arm 68 and is secured in place by upstanding lips 69. A rotary actuator 72 (shown in FIGS. 1 and 3) rotates the transport arm 68 between an operating position as indicated by dashed lines 68' and a retracted position within the sub-chamber 62, and the UV radiation source plate 66 is moved by the transport arm 68 from a retracted position within sub-chamber 62 to an extended position as indicated by dashed lines 66' directly over support member 54 within the chamber 42.

In operation, referring simultaneously to FIGS. 1 and 4, a substrate 46 positioned on a robot blade 51 is transported through slit valve 55 into the processing chamber above the support member 54. Lift pins 57 extending through the support member 54 are moved up by actuator 59 to lift the substrate 46 off the robot blade 51. The robot blade 51 then retracts and is withdrawn from the chamber 42, and the substrate support member 54 is raised by actuator 58 into a position immediately below the bottom surface of substrate 46. As the substrate is positioned on the support member 54, the electrostatic chuck engages to securely hold the substrate 46 on the support member 54. The substrate 46 and the support member 54 are raised further to the processing position, as indicated by dashed lines 46' and 54', and remain in the processing position for a predetermined period of time to accomplish the processing operation. After processing, the substrate support member 54 is lowered, and the lift pins 57 are engaged to lift the processed substrate 46 off the substrate support member 54. The robot blade 51 is reinserted into the chamber 42 under the substrate 46, and the lift pins 57 are lowered to position the substrate 46 onto the robot blade 51. The robot blade 51 with the processed substrate 46 thereon then retracts out of the chamber.

As the robot blade 51 retracts, the rotary actuator 72 rotates the transport arm 68 having a UV radiation source plate 66 thereon into a cleaning position directly over the support member 54. Preferably, a cleaning gas, such as oxygen, is introduced through a cleaning gas inlet (not shown) in the support member into the space between the support member 54 and the UV radiation source plate 66. Alternatively, the cleaning gas can be introduced through the gas inlet 86 into the chamber. The temperature of the support member 54 is raised by a heater (not shown) incorporated within the support member 54 to between about 100° C. and about 600° C., preferably between about 450° C. and about 500° C. With the UV radiation source plate 66 positioned above the substrate support member 54, the pressure in the region between the surface of the substrate support member 54 and the UV radiation source plate 66 is elevated by the introduction of the cleaning gas into the region through a cleaning gas inlet (not shown) in the support member 54. This higher pressure facilitates heat transfer and enhances the cleaning operation. The UV radiation source 82 is then turned on to emit UV radiation in the desired wavelengths, preferably about 184.9 nm and about 253.7 nm when the cleaning gas is oxygen, directly onto the surface to be cleaned and indirectly by the focusing reflectors 84.

The invention provides a cleaning process using a combination of ultraviolet (UV) radiation and a cleaning gas. In this process, a cleaning gas such as oxygen is exposed to UV radiation at selected wavelengthes. For example, UV radiation wavelengths of 184.9 nm and 253.7 nm optimizes cleaning using oxygen as the cleaning gas because oxygen absorbs the 184.9 nm wavelength and generates ozone and elemental oxygen, and the 253.7 nm wavelength is absorbed by the ozone, which devolves into both oxygen gas as well as elemental oxygen. The atomic oxygen reaction with the electrostatic chuck contaminants combined with the UV radiation (especially the 253.7 nm wavelength) and heat acting on the contaminants create the synergy that effectively cleans the chuck surface. In the cleaning process, elemental oxygen reacts with hydrocarbons and carbon species that are present on the surface of the chuck to form carbon monoxide and carbon dioxide that can be pumped out of the chamber through the gas exhaust 88. Heating the support member 54 and creating a higher differential pressure in the region between the UV radiation plate 66 and the support member 54 enhance the reaction rate between elemental oxygen and the contaminants. The resultant volatile reactants and contaminants are pumped out of the chamber to complete the cleaning process. However, if oxygen is chosen as the cleaning gas, it is necessary to use a pump other than a cryogenic pump to evacuate the chamber following the cleaning because ozone absorption by a cryogenic pump creates a safety hazard that can harm the processing system. One particular suitable pump for a cleaning process using oxygen as the cleaning gas is a turbo molecular pump.

Other gases, such as argon and nitrogen, can be used, resulting in similar cleaning effects. The optimal wavelength of the UV radiation and cleaning temperature can be determined through experimentation according to the contaminants to be removed. Generally, the energy applied to the contaminants must be sufficient to break the bonds adhering the contaminants to the surface to be cleaned.

One embodiment of the invention provides a removable UV radiation source plate of substantially the same shape and size as the substrate being processed in the processing chamber and is capable of "on the fly" exchange of used and new UV radiation source plates. When a new UV radiation plate is desired, the actuator 72 rotates the transport arm 68 having a used UV radiation source plate 66 thereon into a position directly over support member 54. The lift pins 57 extend upwards and lift the used UV radiation source plate 66 above the transport arm 68. The robot blade 51 then extends into the chamber under the used UV radiation source plate 66 but above the transport arm 68. The lift pins 57 retract and lower the used UV radiation source plate 66 onto the robot blade 51 to be transported out of the chamber 42 and into a discharge bin. A new UV radiation source plate is placed on the robot blade 51 and transferred into the chamber 42 where it is lifted above the robot blade 51 by lift pins 57. After the blade 51 retracts out of the chamber 42, the lift pins 57 retract and lower the new UV radiation source plate 66 onto transport arm 68 to assume its operational role. This completes the "on the fly" exchange of new and used UV radiation source plates, and the robot blade 51 is then ready to pick up the next unprocessed substrate. Alternatively, the UV radiation source plate 66 can be permanently mounted or secured on the transport arm 68.

Figure 5:
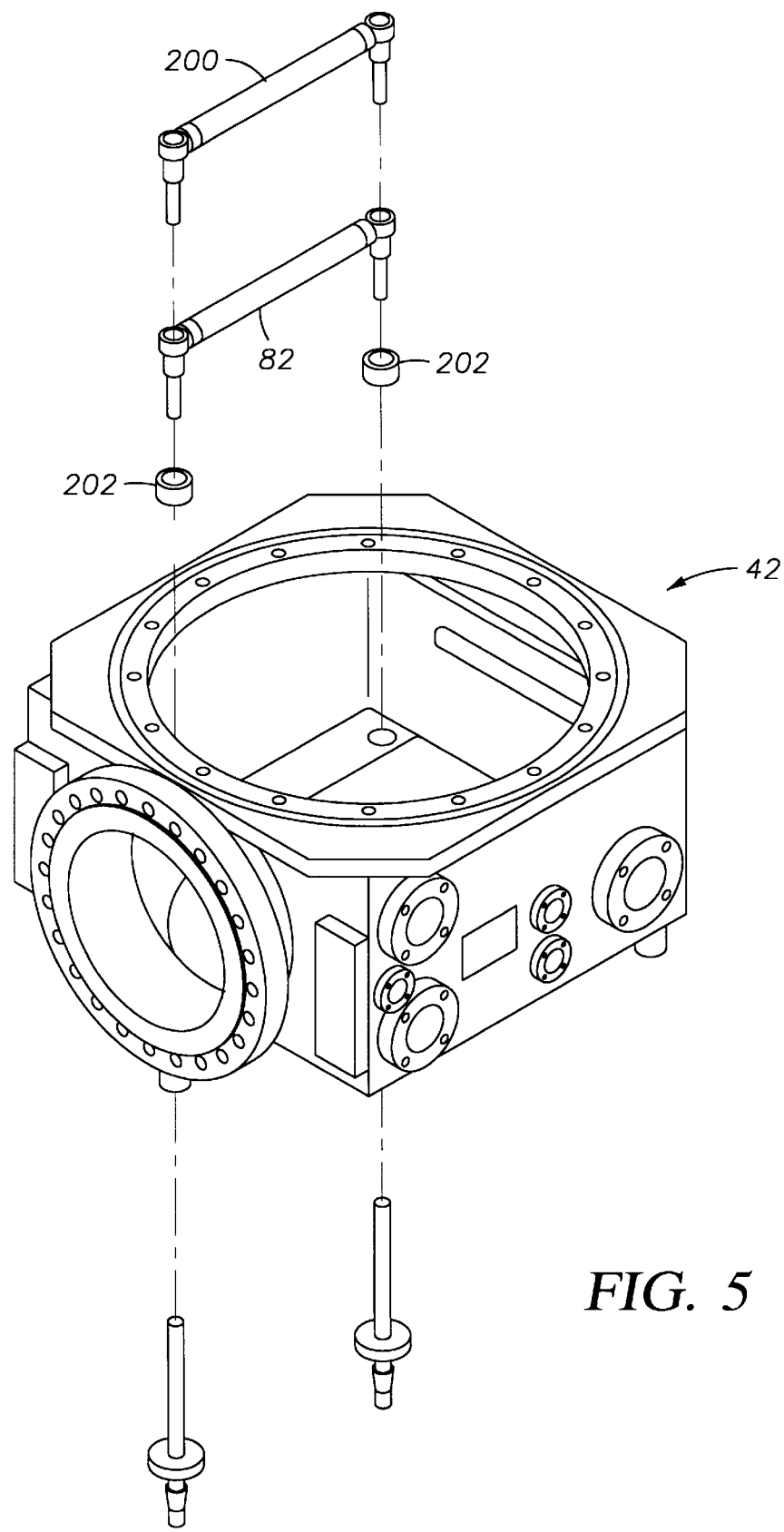
FIG. 5 is a perspective view of another embodiment of the invention.

FIG. 5 is a perspective view of another embodiment of the invention. In this embodiment, a UV radiation lamp 206 is mounted adjacent a bake out lamp 200 or in place of the bake out lamp 200. The UV radiation lamp 206 and the bake out lamp can be mounted and secured by fasteners 202 and 204. To take full advantage of the UV radiation source in this embodiment, the bake out lamps 200 and the UV radiation lamp 206 may need to be repositioned in an upper portion of the processing chamber above the substrate support 54. In operation, after the processed substrate has been removed from the chamber, a cleaning gas is supplied into the chamber, and the UV radiation lamp 206 is simply turned on to clean the surfaces of the chamber.

The invention advantageously provides a faster cleaning process than current methods of UV radiation/ozone cleaning, both in the cleaning process itself and the elimination of the system shut down time for cleaning. Because the invention allows cleaning without breaking vacuum, the invention eliminates up to eight hours of downtime that may be required to evacuate a chamber back to vacuum after cleaning and provides continuous substrate processing with minimal interruption. Another advantage is that the invention provides a compact-sized UV cleaning device that is shielded from contamination during substrate processing.

Although a rotary transfer arm configuration has been disclosed as the preferred means of moving a UV radiation source plate into and out of the processing chamber, alternatives such as a reciprocable blade, or other types of plate transport means can be utilized effectively as well. Furthermore, it will be appreciated that the novel combination of functional elements disclosed above is not limited to sputtering applications or electrostatic chucks and in fact will have application in similar apparatus used to implement many other substrate deposition and/or etching processes.

While the foregoing is directed to the preferred embodiment of the present invention, other and further embodiments of the invention may be devised without departing from the basic scope thereof, and the scope thereof is determined by the claims which follow.

I claim:

1. An apparatus for cleaning a surface in a substrate processing system, comprising:
    a) an ultraviolet (UV) radiation plate moveable between a cleaning position and a storage position while the processing system remains under vacuum; and
    b) at least one UV radiation source disposed on the UV radiation plate.

2. The apparatus of claim 1, further comprising a reflector disposed adjacent the UV radiation source to focus emitted UV radiation.

3. The apparatus of claim 1, further comprising an electrical connector disposed on the UV radiation plate, the connector connectable to a power source to deliver electrical power to the UV radiation source.

4. The apparatus of claim 1, further comprising transport arm moveable between a cleaning position and a storage position, the transport arm having a UV radiation plate support surface.

5. The apparatus of claim 4, further comprising a rotary actuator pivotally attached to the transport arm to move the UV radiation plate between the cleaning position and the storage position.

6. The apparatus of claim 4 wherein the transport arm includes a lip adjacent the UV radiation plate support surface to hold the UV radiation plate.

7. The apparatus of claim 6, further comprising an electrical socket disposed on the lip, the electrical socket adapted to receive an electrical connector disposed on the UV radiation plate.

8. A semiconductor processing system comprising:
    a) a processing chamber having a gas inlet and a gas outlet;
    b) a substrate support member disposed within the processing chamber;
    c) a storage chamber connected to the processing chamber;
    d) a transport arm moveable between a cleaning position above the substrate support member within the processing chamber and a storage position within the storage chamber while the processing system remains under vacuum;
    e) an UV radiation plate disposed on the transport arm; and
    f) at least one UV radiation source disposed upon the UV radiation plate.

9. The processing system of claim 8, further comprising: a rotary actuator pivotally attached to the transport arm to move the UV radiation plate between the cleaning position and the storage position.

10. The processing system of claim 8 wherein the transport arm includes a UV radiation plate support surface having lips to hold the UV radiation plate.

11. The processing system of claim 8 further comprising a reflector disposed adjacent the UV radiation source to focus emitted UV radiation.

12. The apparatus of claim 8 wherein the UV radiation plate is transportable by a substrate transport robot into and out of the processing chamber.

13. The apparatus of claim 8 wherein the substrate support member includes a cleaning gas inlet.

14. A method of cleaning a surface in a semiconductor substrate processing chamber, comprising:
    a) providing a UV radiation plate having at least one UV radiation source disposed thereon;
    b) moving the UV radiation plate into a cleaning position while the processing chamber remains under vacuum;
    c) introducing a cleaning gas into the processing chamber; and
    d) exposing the surface to UV radiation.

15. The method of claim 14, further comprising:
    raising the temperature of the surface to a cleaning temperature; and
    evacuating the cleaning gas from the processing chamber.

16. The method of claim 15 wherein the cleaning temperature is between 100° C. and 600° C.

17. The method of claim 15, further comprising providing a turbo molecular pump to evacuate the cleaning gas.

18. The method of claim 14 wherein the cleaning gas is selected from argon, nitrogen, or oxygen.

19. The method of claim 14 wherein the UV radiation source emits UV radiation with wavelengths of about 184.9 nm and about 253.7 nm.

20. The method of claim 14, further comprising a reflector disposed adjacent the UV radiation source to focus emitted UV radiation.

21. A semiconductor processing chamber, comprising:
    a) an enclosure;
    b) a substrate support member disposed within the enclosure;
    c) a process gas inlet attached to the enclosure; and
    d) at least one UV radiation source disposed on a moveable UV radiation plate in the enclosure to emit UV radiation onto a surface in the enclosure to be cleaned while the processing chamber remains under vacuum.

22. The semiconductor processing chamber of claim 21, further comprising a cleaning gas source connected to the process gas inlet.

23. The semiconductor processing chamber of claim 22 wherein the cleaning gas source comprises a gas selected from argon, nitrogen, or oxygen.

24. The semiconductor processing chamber of claim 21 wherein the substrate support member is a ceramic electrostatic chuck.

25. The semiconductor processing chamber of claim 21, further comprising a reflector disposed adjacent the UV radiation source to focus emitted UV radiation.

26. A method of cleaning a surface in a semiconductor substrate chamber, comprising:

a) providing at least one UV radiation source disposed on a moveable plate in the chamber to emit UV radiation onto a surface in the chamber to be cleaned;

b) introducing a cleaning gas into the processing chamber; and c) exposing the surface to UV radiation while the processing chamber remains under vacuum.

27. The method of claim 26 wherein the cleaning gas is selected from argon, nitrogen, or oxygen.

28. The method of claim 26 wherein the UV radiation source emits UV radiation with wavelengths of about 184.9 nm and about 253.7 nm.

29. The method of claim 26, further comprising a reflector disposed adjacent the UV radiation source to focus emitted UV radiation.

* * * * *